(12) United States Patent
Ho et al.

(10) Patent No.: US 6,469,897 B2
(45) Date of Patent: Oct. 22, 2002

(54) CAVITY-DOWN TAPE BALL GRID ARRAY PACKAGE ASSEMBLY WITH GROUNDED HEAT SINK AND METHOD OF FABRICATING THE SAME

(75) Inventors: Tzong-Da Ho, Taichung (TW); Chien-Ping Huang, Hsinchu (TW); Han-Ping Pu, Taipei (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/774,211

(22) Filed: Jan. 30, 2001

(65) Prior Publication Data

US 2002/0114133 A1 Aug. 22, 2002

(51) Int. Cl.$^7$ ................................................ H05K 7/20
(52) U.S. Cl. ................ 361/704; 29/890.3; 257/707; 257/713; 257/780; 257/786; 257/693; 257/738; 174/51; 174/264; 361/718; 361/722; 438/122
(58) Field of Search .................... 29/890.03; 165/80.2, 165/185; 174/16.3, 252, 262–265, 51, 52.4; 257/706–708, 691, 693, 698–699, 712–713, 720, 737–738, 777–780, 786, 791; 361/704, 707, 710, 717–720, 722, 749, 780, 794; 438/121–122

(56) References Cited

U.S. PATENT DOCUMENTS

| | | | | |
|---|---|---|---|---|
| 5,409,865 A | * | 4/1995 | Karnezos | 257/738 |
| 5,739,581 A | * | 4/1998 | Chillara et al. | 257/738 |
| 5,796,170 A | * | 8/1998 | Marcantonio | 257/786 |
| 5,844,168 A | * | 12/1998 | Schueller et al. | 257/779 |
| 6,020,637 A | * | 2/2000 | Karnezos | 257/738 |
| 6,288,900 B1 | * | 9/2001 | Johnson et al. | 165/185 |
| 6,326,244 B1 | * | 12/2001 | Brooks et al. | 438/124 |

* cited by examiner

Primary Examiner—Gregory Thompson
(74) Attorney, Agent, or Firm—Peter F. Corless; Steven M. Jensen; Edwards & Angell, LLP

(57) ABSTRACT

A TBGA (Tape Ball Grid Array) package assembly with grounded heat sink and method of fabricating the same is provided, which is constructed of a tape, a heat sink, and at least one semiconductor chip. The proposed TBGA technology is characterized by that a grounding plug is formed by first forming a via hole in the heat sink and a via hole in the tape without penetrating through the grounding solder-ball pad, and then filling an electrically-conductive material, such as solder or silver paste, into the heat-sink via hole from the top of the package assembly until filling up the tape via hole and the heat-sink via hole. As the semiconductor chip is mounted in position, its grounding pads are electrically bonded to the heat sink, thereby allowing the semiconductor chip to be externally grounded through the grounding plug, the grounding solder-ball pad, and the solder ball attached to the grounding solder-ball pad. The proposed TBGA technology allows the resulted grounding plug to be firmly secured in position due to the filled solder being wettable to the heat sink, thereby providing a greater ball shear strength to the grounding solder ball that is subsequently bonded to the grounding plug. The finished TBGA package would be therefore assured in the reliability of its grounding structure.

12 Claims, 4 Drawing Sheets

CAVITY-DOWN TAPE BALL GRID ARRAY PACKAGE ASSEMBLY WITH GROUNDED HEAT SINK AND METHOD OF FABRICATING THE SAME

BACKGROUND OF THE INVENTION

1. Field of the Invention

This invention relates to integrated circuit packaging technology, and more particularly, to a TBGA (Tape Ball Grid Array) package assembly with grounded heat sink and method of fabricating the same.

2. Description of Related Art

BGA (Ball Grid Array) is an advanced type of integrated circuit packaging technology which is characterized by the use of a substrate having a front surface for mounting a semiconductor chip and a back surface provided with a ball grid array (i.e., an array of solder balls) to serve as external connecting points for the packaged semiconductor chip to be electrically coupled to external circuitry such as a printed circuit board (PCB).

TBGA (Tape Ball Grid Array) is an improved type of BGA technology which is characterized by the use a of thin tape, typically made of polyimide, as the substrate for mounting the semiconductor chip and the ball grid array. The TBGA technology allows the overall package size to be made very compact in size.

FIG. 1A is a schematic sectional diagram showing an example of a conventional TBGA package assembly. As shown, this TBGA package assembly includes: (a) a tape 110; (b) a heat sink 120 having a downward-facing chip-mounting cavity 121 and adhered to the tape 110 by means of an adhesive layer 113; (c) a semiconductor chip 130 mounted in the chip-mounting cavity 121 of the heat sink 120; (d) an array of solder-ball pads 140 provided on the back surface of the tape 110, including a subgroup of grounding solder-ball pads 141 and a subgroup of I/O solder-ball pads 142; (e) a solder mask 150 formed on the back surface of the tape 110 while exposing the solder-ball pads 140; (f) a plurality of grounding plugs 160 formed in the tape 110, which connect the heat sink 120 to the grounding solder-ball pads 141; (g) a set of bonding wires 170 bonded to the semiconductor chip 130, including a subset of grounding wires 171 and a subset of I/O wires 172; (h) a ball grid array 180 (i.e., an array of solder balls) attached to the array of solder-ball pads 140, including a subgroup of grounding solder balls 181 and a subgroup of I/O solder balls 182; (i) an encapsulation body 190 for encapsulating the semiconductor chip 130.

The foregoing package assembly is characterized by that the semiconductor chip 130 can be connected to external grounding points (not shown) via a grounding path composed of the grounding wire 171, the heat sink 120, the grounding plugs 160, the grounding solder-ball pads 141, and the grounding solder balls 181, as indicated by the dotted arrows in FIG. 1A. During SMT (Surface Mount Technology) process for mounting the finished TBGA package on a PCB (not shown), it allows the packaged semiconductor chip 130 to be connected to the PCB's grounding lines (not shown) via the grounding solder balls 181.

Further, as shown in FIG. 1B and FIG. 1C, by conventional TBGA technology, each grounding plug 160 is formed by first punching a hole 161 through each grounding solder-ball pad 141 into the tape 110, and then filling each punched hole 161 with an electrically-conductive material, such as solder or silver epoxy.

The forgoing process step for forming the grounding plugs 160, however, has the following drawbacks.

First, as illustrated in FIG. 1C, since the polyimide-made tape 110 is non-wettable to solder, a tiny gap 162 would be undesirably left between each resulted grounding plug 160 and the inner wall of the punched hole 161, making the grounding plug 160 only bonded to the heat sink 120 but unbonded to the inner wall of the punched hole 161 and thus loosely secured in position. In addition, since the punched hole 161 is formed by punching through each grounding solder-ball pad 141, it will reduce the effective solder wetting area of the grounding solder-ball pad 141, making the substantially attached grounding solder ball 181 to be reduced in overall bonding strength, resulting in a weak ball shear strength to the grounding solder ball 181. This would undesirably cause potential reliability problem to the finished TBGA package.

Second, since the opening of the punched hole 161 for the grounding plug 160 is on the back surface of the tape 110, it requires the solder used to form the grounding plug 160 to be filled from the bottom side of the package assembly into the punched hole 161, which is considered a difficult process step.

Third, it would undesirably cause some moisture or air to be trapped in the punched hole 161, undesirably making the resulted grounding plug 160 to be poorly bonded to the heat sink 120 and bulged out in position that would cause the subsequently attached grounding solder balls 181 to be also bulged out in position with respect to the I/O solder balls 182, thus making the overall ball grid array 180 uncoplanarized that would degrade the quality of SMT (Surface Mount Technology) process for mounting the finished TBGA package on a printed circuit board (not shown).

Patents related to TBGA fabrication, include, for example, the U.S. Pat. No. 6,020,637 entitled "BALL GRID ARRAY SEMICONDUCTOR PACKAGE". By this patented technology, however, since it also involves the fabrication of grounding plugs by punching through the grounding solder-ball pad and the tape, the above-mentioned drawbacks still exist.

SUMMARY OF THE INVENTION

It is therefore an objective of this invention to provide a new TBGA technology which can allow grounding solder balls to have greater ball shear strength so as to make them more firmly secured in position.

It is another objective of this invention to provide a new TBGA technology which allows the electrically-conductive material used to form the grounding plug to be filled from the top side of the package assembly instead of from the bottom side, so as to make the filling step easier to carried out.

In accordance with the foregoing and other objectives, the invention proposes a new TBGA package and method of fabricating the same.

The TBGA technology according to the invention is characterized by that the grounding plug is formed by first forming a via hole in the heat sink and a via hole in the tape without penetrating through the grounding solder-ball pad, and then filling an electrically-conductive material, such as solder or silver paste, into the heat-sink via hole from the top of the package assembly until filling up the tape via hole and the heat-sink via hole. As the semiconductor chip is mounted in position, its grounding pads are electrically bonded to the heat sink, thereby allowing the semiconductor chip to be externally grounded through the grounding plug, the grounding solder-ball pad, and the grounding solder ball.

The TBGA technology of the invention allows the resulted grounding plug to be firmly secured in position due to the filled solder being wettable to the heat sink, thereby providing a greater ball shear strength to the grounding solder ball that is subsequently bonded to the grounding plug. The finished TBGA package is therefore more assured in the reliability of its grounding structure.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The new TBGA technology according to the invention is disclosed in full details by way of preferred embodiments in the following with reference to FIGS. 2A–2D.

Figure 1A:
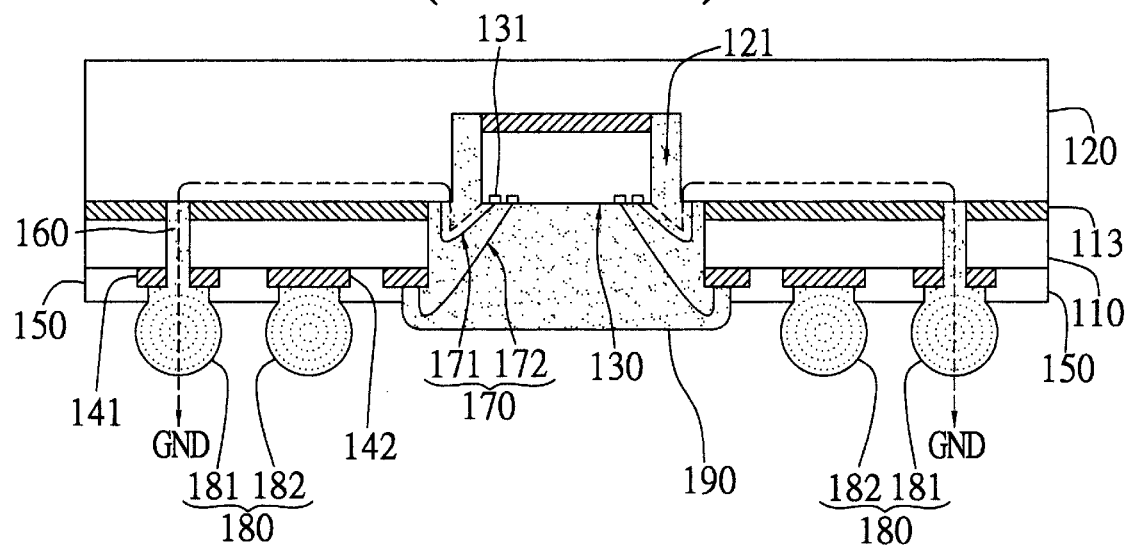
FIGS. 1A–1C (PRIOR ART) are schematic sectional diagrams used to depict a conventional TBGA package assembly.
Figure 1B:
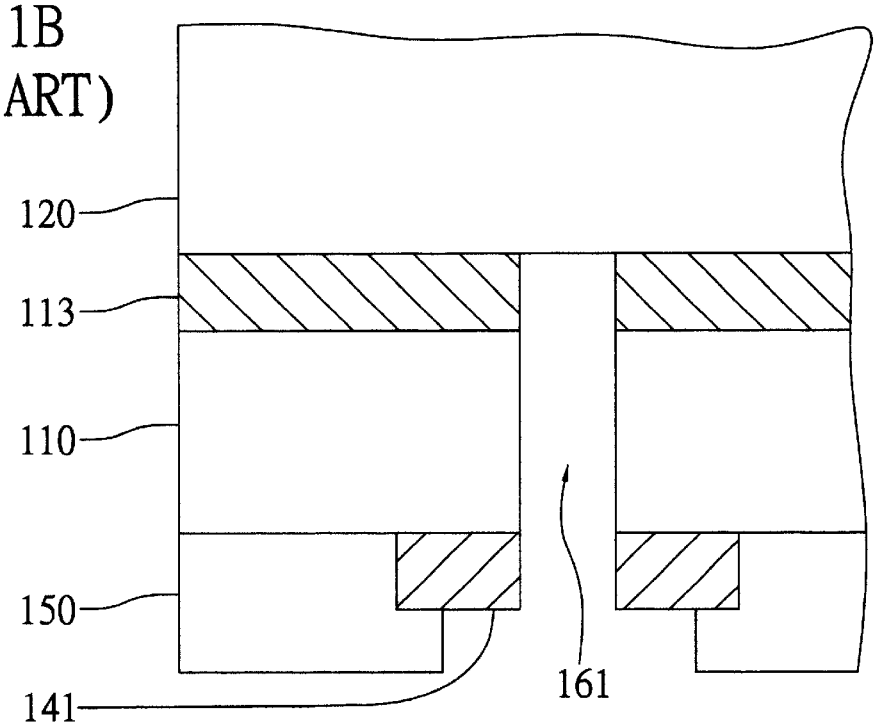
Figure 1C:
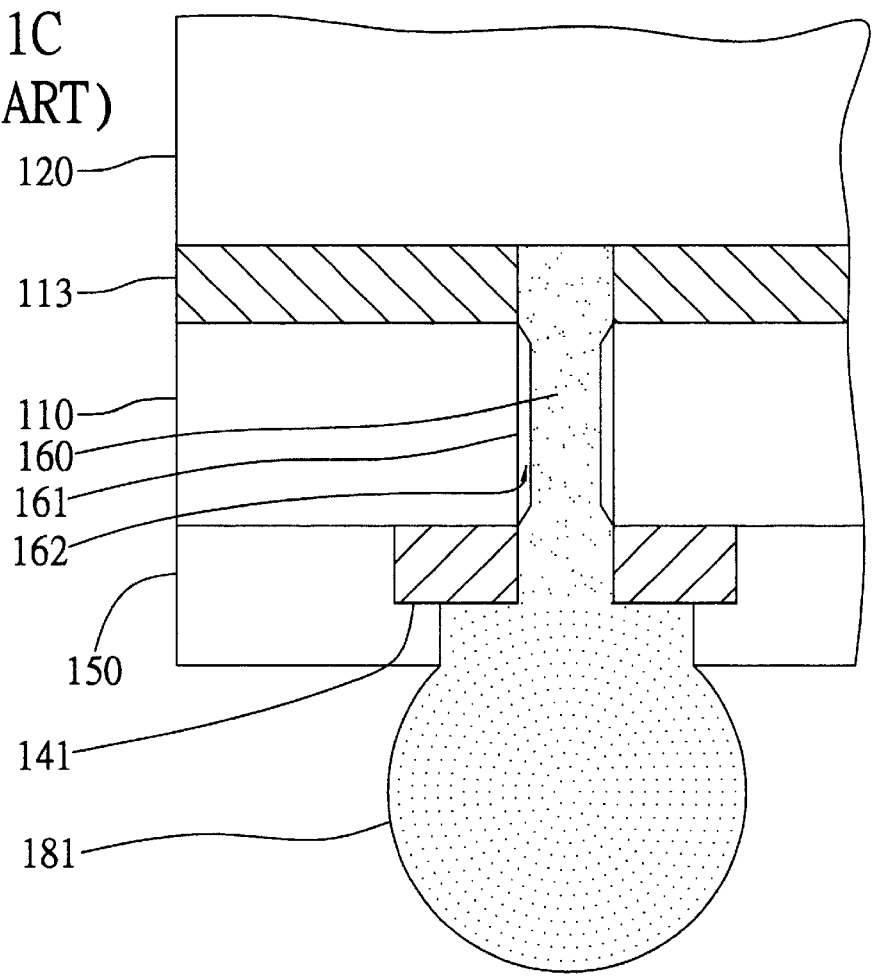
Figure 2A:
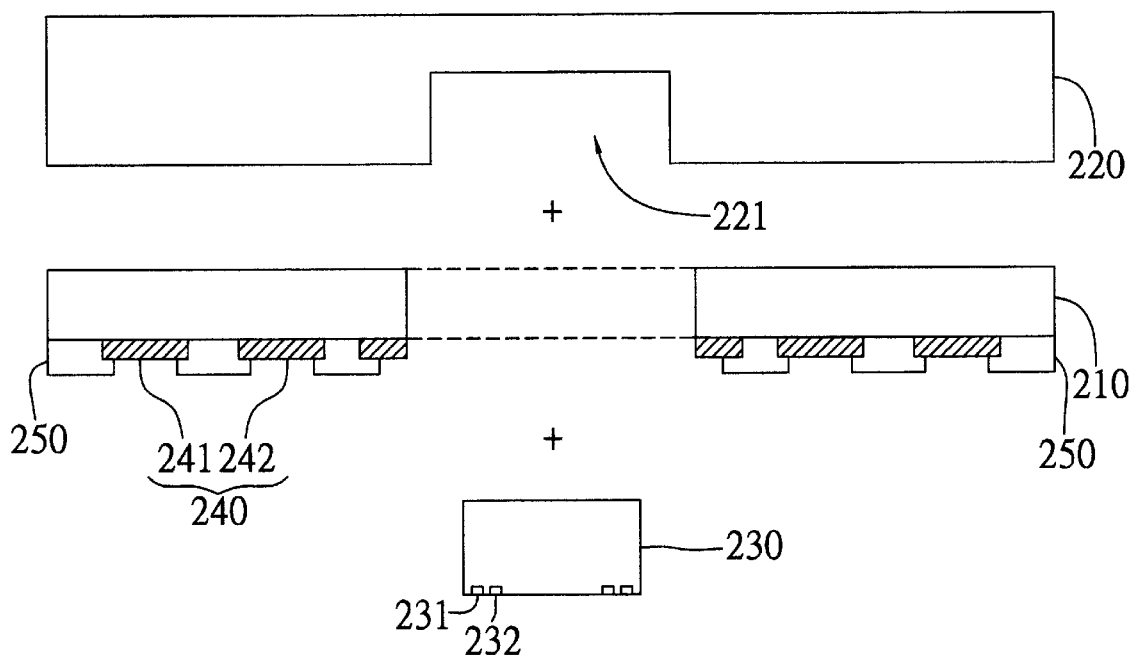
FIGS. 2A–2D are schematic sectional diagrams used to depict the fabrication of a TBGA package by the invention.

Referring to FIG. 2A, by the TBGA technology according to the invention, the first step is to prepare a tape 210, a heat sink 220, and a semiconductor chip 230.

The tape 210 is made of polyimide and whose back surface is formed with an array of solder-ball pads 240 including a subgroup of grounding solder-ball pads 241 and a subgroup of I/O solder-ball pads 242. Further, a solder mask 250 is formed over the back surface of the tape 210 while exposing the solder-ball pads 240.

The heat sink 220 is an integrally formed piece of a thermally-conductive material, such as copper (Cu), and which is formed with a downward-facing chip-mounting cavity 221. The term "cavity-down TBGA package" is so named due to the downward-facing structure of the chip-mounting cavity 221.

The semiconductor chip 230 can be any type of integrated circuit device, which is formed with a plurality of grounding pads 231 and a plurality of I/O pads 232 on the active surface thereof.

Figure 2B:
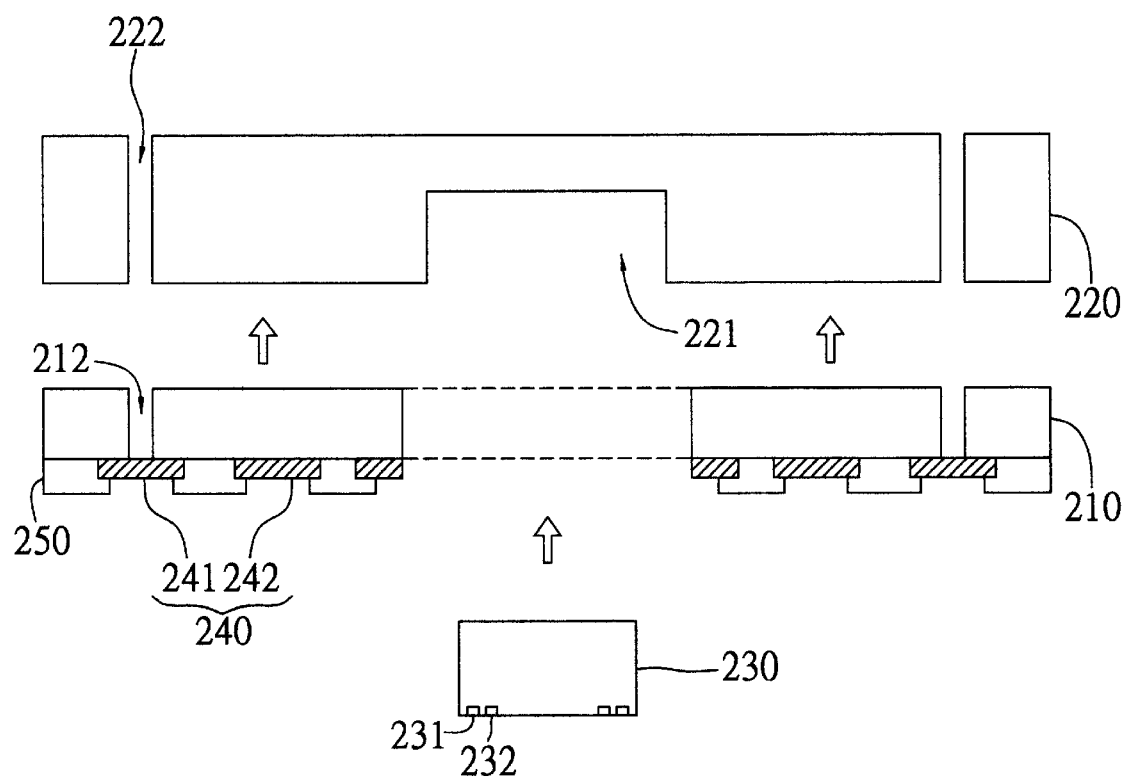

Referring further to FIG. 2B, in the next step, a via hole 222 (hereinafter referred to as "heat-sink via hole") is formed in the heat sink 220 at a predefined location aligned to each grounding solder-ball pad 241. The heat-sink via hole 222 can be formed either by etching or punching through the heat sink 220.

In addition, a via hole 212 (hereinafter referred to as "tape via hole") is formed in the tape 210 at a predefined location aligned to the heat-sink via hole 222 and also aligned to the grounding solder-ball pad 241 without penetrating the grounding solder-ball pad 241.

Figure 2C:
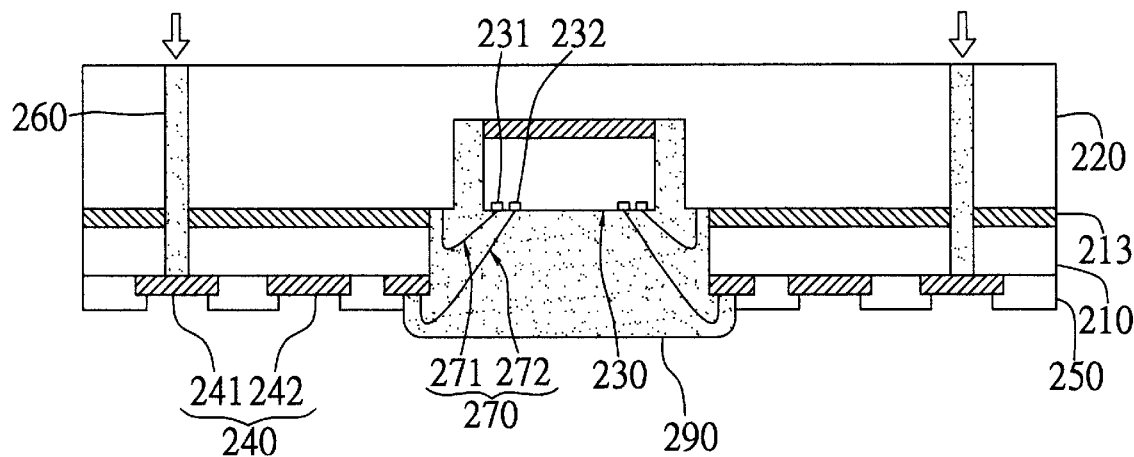

Referring further to FIG. 2C, in the next step, the tape 210, the heat sink 220, and the semiconductor chip 230 are assembled in such a manner that the tape 210 is attached to the heat sink 220 by means of an adhesive layer 213 to the tape 210, with the tape via hole 212 being joined to the heat-sink via hole 222; and the semiconductor chip 230 is mounted inside the chip-mounting cavity 221 of the heat sink 220 and adhered to the heat sink 220. Further, a wire-bonding process is performed to bond a set of bonding wires 270 to the semiconductor chip 230, including a subset of grounding wires 271 for electrically bonding the grounding pads 231 of the semiconductor chip 230 to the heat sink 220, and a subset of I/O wires 272 for electrically bonding the I/O pads 232 of the semiconductor chip 230 to the electrically-conductive traces (not shown) on the tape 210 that are connected to the I/O solder-ball pads 242.

It is a characteristic feature of the invention that an electrically-conductive material, such as solder or silver epoxy, is filled from the top side of the package assembly into each heat-sink via hole 222 until substantially filling up the entirety of the tape via hole 212 and the heat-sink via hole 222 to thereby form a grounding plug 260 serving to electrically connect the heat sink 220 to the grounding solder-ball pad 241. Although the filled solder is non-wettable to the polyimide-made tape 210, it is nevertheless wettable to the heat sink 220, thereby being firmly bonded to the inner wall of the heat-sink via hole 222, allowing the resulted grounding plug 260 to be firmly secured in position.

Figure 2D:
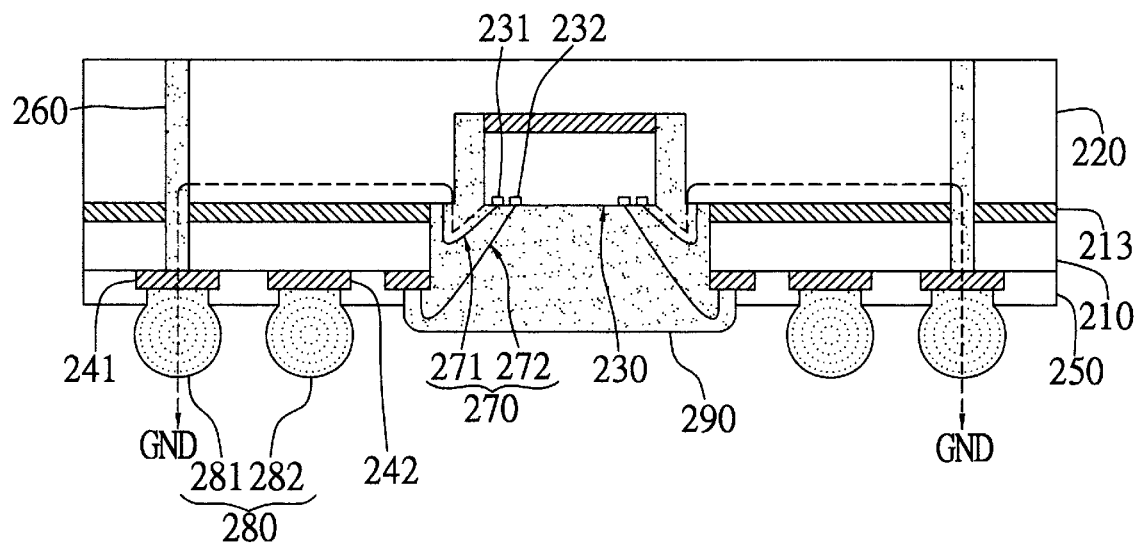

Referring further to FIG. 2D, in the next step, a ball grid array 280 (i.e., an array of solder balls) is attached to the array of solder-ball pads 240 on back surface of the tape 210, including a subgroup of grounding solder balls 281 attached respectively to the grounding solder-ball pads 241 and a subgroup of I/O solder balls 282 attached respectively to the I/O solder-ball pads 242. Moreover, an encapsulation body 290 is formed to encapsulate the semiconductor chip 230. This completes the TBGA fabrication according to the invention.

It can be seen that the grounding pads 231 on the semiconductor chip 230 are electrically connected successively via the grounding wires 271, the heat sink 220, the grounding plugs 260, and the grounding solder-ball pads 241 to the grounding solder balls 281. The grounding solder balls 281 therefore serve as external grounding points for the packaged semiconductor chip 230. During SMT (Surface Mount Technology) process for mounting the finished TBGA package on a PCB (not shown), it allows the semiconductor chip 230 to be connected to the PCB's grounding lines (not shown) via the grounding solder balls 281.

In conclusion, the invention provides a new TBGA technology which is characterized by that a grounding plug is formed by first punching through the heat sink and the tape without punching through the grounding solder-ball pad, and then filling solder or silver epoxy into the heat-sink via hole from the top of the package assembly until substantially filling up the tape via hole and the heat-sink via hole. Compared to the prior art, the TBGA technology according to the invention has the following advantages.

First, since the filled solder is wettable to the heat sink 220, the resulted grounding plug 260 can be firmly bonded to the inner wall of the heat-sink via hole 222 without leaving a tiny gap therebetween In addition, since the grounding plug 260 is formed without punching through the grounding solder-ball pads 241, it allows the subsequently attached grounding solder ball 281 on the grounding solder-ball pads 241 to be more securely bonded in position. As a total effect, the invention allows the grounding solder balls 281 to have a greater ball shear strength that can make them very firmly secured in position.

Second, since the grounding plug 260 is formed by filling solder from the top side of the package assembly into the heat-sink via hole 222 (rather than from the bottom side of the package assembly as in the case of the prior art), the involved process step would be easier to implement than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a TBGA package, comprising the steps of:

(1) preparing a heat sink, a tape, and a semiconductor chip; wherein
       the tape is predefined with an array of solder-ball pads including at least one grounding solder-ball pad;
       the heat sink is predefined with a chip-mounting cavity; and
       the semiconductor chip includes at least one grounding pad;

(2) forming a via hole in the heat sink at a predefined location aligned to the grounding solder-ball pad;

(3) forming a via hole in the tape at a predefined location aligned to the heat-sink via hole and the grounding solder-ball pad without penetrating the grounding solder-ball pad;

(4) attaching the tape to the heat sink, with the tape via hole being joined to the heat-sink via hole;

(5) filling an electrically-conductive material into the heat-sink via hole until substantially filling up the tape via hole and the heat-sink via hole to thereby form a grounding plug serving to electrically connect the heat sink to the grounding solder-ball pad;

(6) mounting the semiconductor chip in the chip-mounting cavity of the heat sink, with the grounding pad of the semiconductor chip being electrically bonded to the heat sink and thereby being electrically connected via the grounding plug to the grounding solder-ball pad; and (7) forming a ball grid array on the array of solder-ball pads on the tape, the ball grid array including at least one grounding solder ball attached to the grounding solder-ball pad to serve as an external grounding point for the semiconductor chip.

2. The method of claim 1, wherein in said step (1), the tape is a polyimide-made tape.

3. The method of claim 1, wherein in said step (2), the heat-sink via hole is formed by etching into the heat sink.

4. The method of claim 1, wherein in said step (2), the heat-sink via hole is formed by punching into the heat sink.

5. The method of claim 1, wherein in said step (3), the tape via hole is formed by punching into the tape.

6. The method of claim 1, wherein in said step (5), the electrically-conductive material used to form the grounding plug is solder.

7. The method of claim 1, wherein in said step (5), the electrically-conductive material used to form the grounding plug is silver epoxy.

8. A TBGA package assembly, which comprises:

(a) a tape having a via hole formed at a predetermined location;

(b) a heat sink attached to the tape and having a chip-mounting cavity, the heat sink being formed with a via hole at a predefined location aligned to the tape via hole;

(c) a semiconductor chip mounted in the chip-mounting cavity of the heat sink, the semiconductor chip having a grounding pad electrically bonded to the heat sink;

(d) a plurality of solder-ball pads formed over one surface of the tape, including at least one grounding solder-ball pad;

(e) a grounding plug formed in the heat-sink via hole and the tape via hole and in electrical contact with the grounding solder-ball pad; and (f) a ball grid array including at least one grounding solder ball attached to the grounding solder-ball pad to serve as an external grounding point for the semiconductor chip.

9. The TBGA package assembly of claim 8, wherein the tape is polyimide-made tape.

10. The TBGA package assembly of claim 8, wherein the grounding plug is made of solder.

11. The TBGA package assembly of claim 8, wherein the grounding plug is made of silver epoxy.

12. The TBGA package assembly of claim 8, wherein the tape via hole is aligned to the grounding solder-ball pad without penetrating the grounding solder-ball pad.

* * * * *